United States Patent [19]

Fernandez

[11] Patent Number: 5,065,050
[45] Date of Patent: Nov. 12, 1991

[54] HIGH-SPEED EMITTER-COUPLED LOGIC BUFFER

[75] Inventor: Francisco J. Fernandez, Reading, Pa.

[73] Assignee: AT&T Bell Laboratories, Murray Hill, N.J.

[21] Appl. No.: 625,515

[22] Filed: Dec. 11, 1990

[51] Int. Cl.$^5$ .................... H03K 19/096; H03K 17/16
[52] U.S. Cl. .................... 307/455; 307/456; 307/272.1; 307/362
[58] Field of Search .................... 307/443, 454–456, 307/272.1, 530, 362, 270

[56] References Cited

U.S. PATENT DOCUMENTS 4,868,420  9/1989  Itoh et al. ............................ 307/455
4,912,347  3/1990  Morris ................................ 307/475

FOREIGN PATENT DOCUMENTS 0009134  1/1982  Japan ................................. 307/455

OTHER PUBLICATIONS

"Family Overview", *F100K ECL Data Book*, Fairchild, 1986, pp. 2-6 through 2-11.
"Bipolar Digital Gate Circuits", *Analysis and Design of Digital Integrated Circuits*, David A. Hodges, Horace G. Jackson, Copyright 1988, pp. 264 through 269.
"10113 Gate", *Data Manual 1986*, Signetics, ECL Products, Jan. 30, 1986, pp. 6-75 & 6-76.
"Key Components of the Fast Reduced Instruction Set Computer (FRISC) Employing Advanced Bipolar Differential Logic and Wafer Scale Multichip Packaging", *IEEE 1988 Bipolar Circuits & Technology Meeting*, H. J. Greub, J. F. McDonald, T. Creedon, Paper 1.1, pp. 19-22.

*Primary Examiner*—Stanley D. Miller
*Assistant Examiner*—Margaret Rose Wambach
*Attorney, Agent, or Firm*—Scott W. McLellan

[57] ABSTRACT

An emitter-coupled logic (ECL) buffer circuit using two differential pairs of transistors to limit the output voltage of the buffer to ECL signal levels. A first differential pair of transistors couples the current from a first current source to load resistors in the buffer, thereby establishing the output voltage for the logical "low" output. The second differential pair couples the current from a second current source, having a current less than the current from the first current source, to the load resistors to establish the output voltage for the logical "high" output.

9 Claims, 2 Drawing Sheets

HIGH-SPEED EMITTER-COUPLED LOGIC BUFFER

BACKGROUND OF THE INVENTION

1. Field of the Invention

This invention relates to logic gate circuitry in general and, more particularly, to emitter-coupled logic output buffer circuitry.

2. Description of the Prior Art

Most integrated circuit packages have limitations on the amount of power a chip (or chips) within the package may dissipate. Exceeding that limitation will cause thermal runaway in the chip, potentially resulting in the catastrophic failure thereof. However, it is generally desirable to place as many gates as possible in each package for increased functionality of the system or subsystem the package is placed in.

In large scale digital integrated circuits having thousands, or even tens of thousands, of logic gates, the power dissipated by each gate is reduced as much as practically possible so as not to exceed the maximum power rating of the package. However, it is recognized that not all the gates drive the same loads; some gates drive other gates on the same chip while others need to drive off-chip gates or terminated low-impedance transmission lines and buses. Hence, it typically the case that while the gates are optimized for minimum power dissipation at a predetermined speed, buffers are provided where a gate needs to drive other gates that are off chip. These buffers are of much higher power than the gates driving them but there are relatively few buffers on each chip. This is illustrated by a simplified diagram shown in FIG. 1. Here a first chip 2 in a system 1 communicates via a bus 3 (typically terminated with 50 Ω terminations) to a receiver 4 on a second chip 5. Driving the bus 3 on chip 2 is a buffer 6 which is driven by gate circuitry 7. There may also be other chips 2,5 on the same bus 3. Similarly, chip 2 may have other buffers 6 driving other buses 3. Because bus 3 may load (usually capacitively) the output of the buffer 6 more than the loading of the buffer 6 on the output of the gate 7, the power handling capacity of buffer 6 will be greater than the power handing capacity of gate 7. The increase in power handling capacity is usually achieved at the expense of higher power dissipation by the buffer 6.

Since a buffer typically does not perform a "logical" function, such as an AND or OR function, the propagation delay of a buffer is an overhead which slows down the overall speed of the logic on the chip. Therefore, it would be desirable to have a buffer circuit which has a small propagation delay without dissipating a lot of power. Alternatively viewed, the bandwidth of the buffer must be wide enough to accommodate the desired speed of the system 1.

For raw speed, emitter-coupled logic (ECL) is the popular choice for the logic type or family in high-speed digital systems. The price paid for such speed is high power dissipation, as discussed above. An ECL family designed for very highspeed applications is the 100K series, made by many manufacturers, such as the Fairchild Company, of Santa Clara, Calif. A typical buffer 10 in the 100K family is shown in FIG. 4. Inputs IN+,IN− couple to transistors 11, 12, forming a differential pair. The common emitters of the differential pair, referred to here as a tail, couple to a current source 13. The collector outputs of the differential pair (transistors 11, 12) couple to load resistors 14, 15 which in turn couple to a power source, here ground. The outputs of the differential pair also couple to a pair of emitter followers 16, 17, the emitters of which couple to the output of the buffer, OUT+,OUT−. A clamping circuit of resistor 18 and paralleled diodes 19, 20 serves to limit the voltage swing of the outputs of the differential pair (11, 12) and provide thermal compensation of the logical "high" and "low" output voltages. The combination of the current from current source 13, the resistances of the loads 14, 15, the clamping voltage of resistor 18 and diodes 19,20, and the base-emitter voltages of transistors 16, 17 determine the logical "high" and logical "low" output voltages on OUT+,OUT−. The clamp circuit (18,19,20) adds considerable amount of capacitive loading between the collectors of transistors 11, 12 and from the collectors to ground. This considerably slows down the operation of the buffer 10 compared operating the buffer without the clamp. Further, the design of the buffer is a compromise between speed, output voltage variations with temperature, and power dissipation. The component values of this design cannot be easily adjusted to optimize the buffer's performance in any or all of these factors.

SUMMARY OF THE INVENTION

It is therefore one aspect of this invention to provide a relatively low power ECL buffer design which provides high speed and predictable logic output voltages over a relatively wide predetermined temperature range.

These and other aspects of the invention may be obtained generally with a conventional ECL buffer having: an input; a first differential pair of transistors, with a tail, first and second inputs coupling to the input of the buffer, and first and second outputs corresponding to the first and second inputs; a first current source coupled to the tail of the first differential pair of transistors; and, first and second loads coupled between a power supply rail and corresponding first and second outputs of the first differential pair of transistors. The conventional ECL buffer is improved by adding a second current source and a current steering means, responsive to the buffer input, for selectively coupling the second current source to either the first or second load. The current from the second current source is less than the current from the first current source. Preferably, the ECL buffer is disposed in an integrated circuit.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
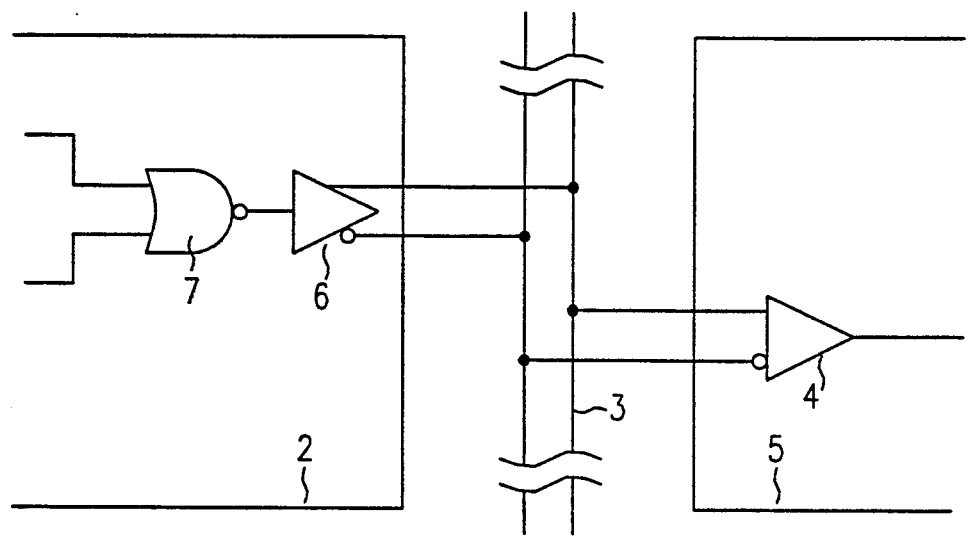
FIG. 1 is a simplified diagram of a digital system illustrating a buffer driving a bus.
Figure 2:
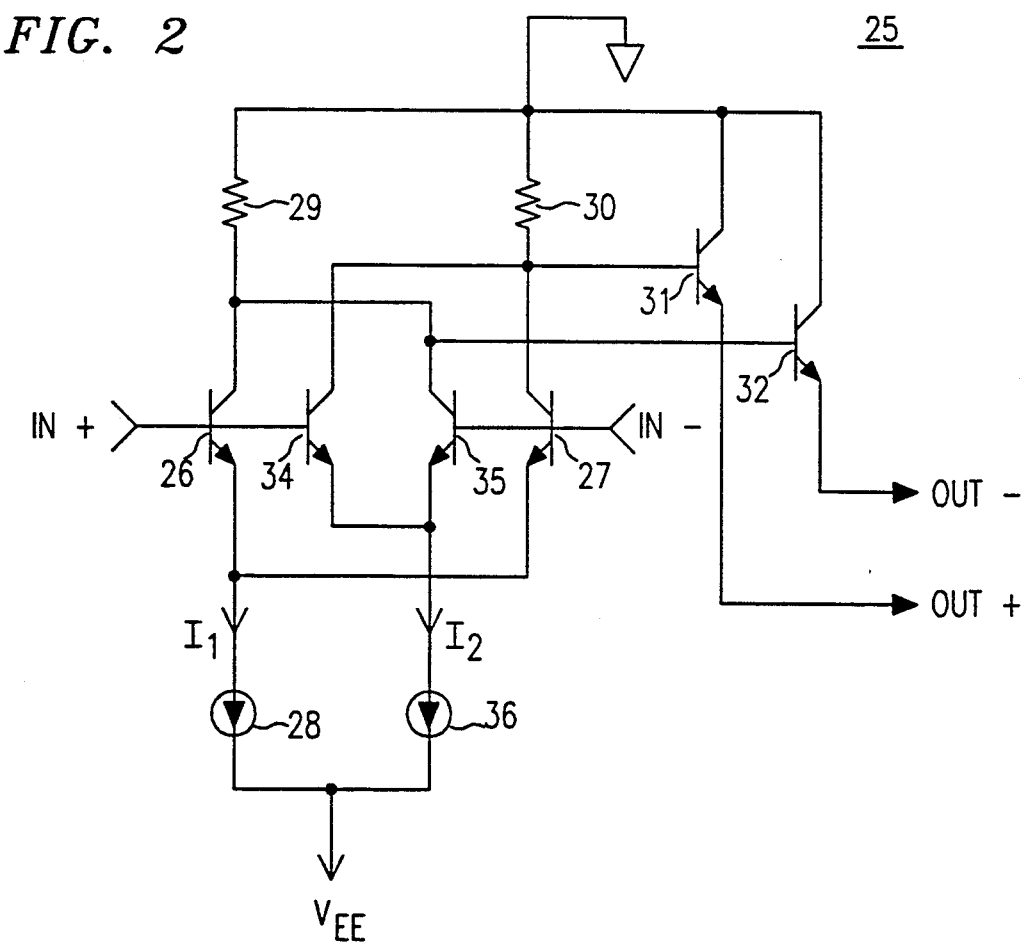
FIG. 2 is a simplified schematic diagram of an ECL buffer according to one aspect of the invention.
Figure 4:
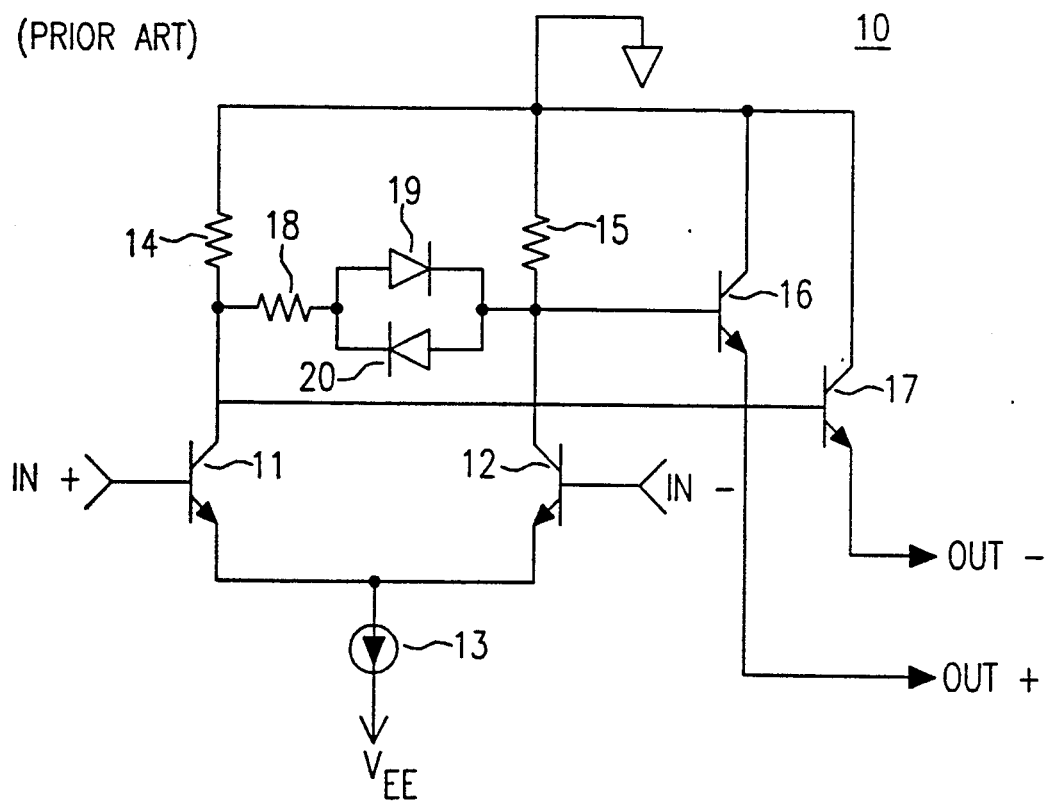

Referring to FIG. 2, an exemplary ECL buffer 25, according to one aspect of the invention, is shown and is preferably disposed in an integrated circuit. The ECL buffer 25 has a first differential pair of transistors 26, 27, the common emitters, or tail, coupling to a first current source 28. The bases of transistors 26, 27 couple to the input IN+,IN— of the buffer 25. Two load resistors 29, 30, preferably having substantially equal resistances, couple to the collectors of transistors 26, 27 and to a first power supply rail, here ground. In addition, transistors 31,32, configured as emitter followers, couple the voltages on the collectors of transistors 26,27 to the outputs OUT+,OUT— of the buffer 25. It is noted that the transistors 26,27,31, and 32, current source 28, and resistors 29, 30 correspond to transistors 11, 12, 16, and 17, current source 13, and resistors 14, 15 in FIG. 4, discussed above. Instead of the clamp circuit of resistor 18 and diodes 19, 20 (FIG. 4), a current steering means (second differential pair of transistors 34, 35) and a second current source 36 is added. This allows, for example, the ECL logical "low" output voltage to be determined substantially by the current $I_1$ supplied by current source 28 while the ECL logical "high" output voltage may be substantially determined by the current $I_2$ supplied by current source 36 ($I_2 < I_1$). Transistors 34, 35 are cross-coupled to transistors 26, 27 so that for each logical state of the inputs IN+,IN—, current sources 28, 36 are coupled to corresponding load resistors 29, 30. It is preferable that transistors 26, 27 and 34, 35 be scaled to maximize the switching speed thereof.

The ECL logical "high" output voltage, $V_{OH}$, and the ECL logical "low" output voltage, $V_{OL}$, appearing on either of the outputs OUT+, OUT— may be determined as follows:

$$V_{OL} = I_1 R + V_{BEL},$$

$$V_{OH} = I_2 R + V_{BEH}$$

wherein $R$ is the resistance of the load resistors 29, 30, and $V_{BEH}$ and $V_{BEL}$ are the base-emitter voltages of transistors 31, 32 when providing a logical "high" output voltage or a logical "low" output voltage, respectively.

It is noted that while the buffer 25 is shown as a fully differential circuit, the buffer 25 may also be adapted to respond to single-ended inputs. For example, the input IN— may be coupled to a fixed voltage source having a voltage between a logical "high" voltage and a logical "low" voltage. This "slices" the input signal coupled to the IN+ imput to determine if a logical "high" "low" is applied.

Figure 3:
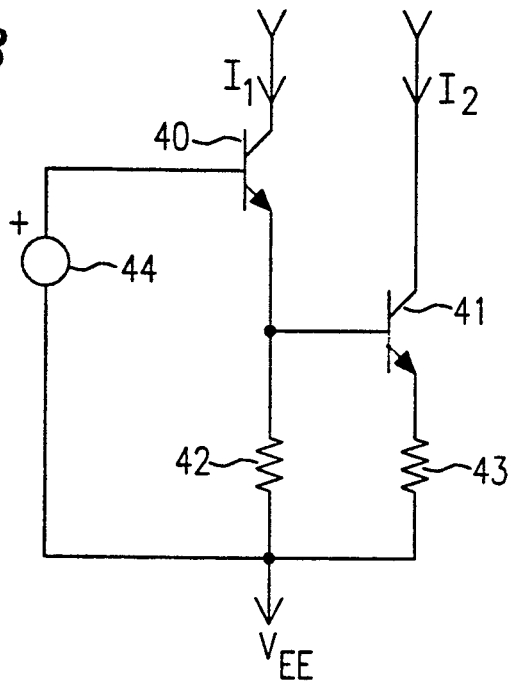
FIG. 3 is a simplified schematic diagram of exemplary current sources used in FIG. 2; and, FIG. 4 is a simplified schematic diagram of a prior art ECL buffer.

An exemplary method of generating the currents $I_1$ and $I_2$ is shown in FIG. 3. Two transistors 40, 41 are connected as shown with resistors 42, 43 disposed in series with the emitters of each transistor 40, 41. The resistors 42, 43 are coupled to a second power supply rail, $V_{EE}$, which is typically held 5.2 volts below ground in ECL logic systems. A fixed, substantially temperature independent, voltage source 44 biases transistors 40, 41 on. The voltage source 44 is preferably derived from a bandgap reference which may be in common with many such buffers 25 (FIG. 2) disposed in a chip. If the resistance values of resistors 42, 43 are approximately the same, the current $I_2$ will be less than the current $I_1$. Further, changes in the currents $I_1$, $I_2$ will change with temperature and compensate for variations in the emitter-base voltages of transistors 31, 32 (FIG. 2) with temperature, thereby holding the output voltages on OUT+, OUT— (FIG. 2) substantially constant with temperature.

EXAMPLE

The following component values were used to model the buffer 25 (FIG. 2), and the current sources 28, 36 (FIG. 3). The resulting buffer is capable of over 1 gigabit operation with ECL compatible output logic levels over an ambient temperature range of 0°–70° C.

| | |
|---|---|
| $V_{EE}$ | −5.2 Volts |
| $I_1$ | 20 mA |
| $I_2$ | 5 mA |
| resistor 29,30 | 50 Ω |
| transistors 26,27 | 1.5 × 120 μm |
| transistors 31,32 | 1.5 × 120 μm |
| transistors 34,35 | 1.5 × 20 μm |
| transistor 40 | 1.5 × 60 μm |
| transistor 41 | 1.5 × 15 μm |
| resistors 42,43 | 50 Ω |
| voltage source 44 | 1.7 Volts |

Having described the preferred embodiment of this invention, it will now be apparent to one of skill in the art that other embodiment incorporating its concept may be used. It is felt, therefore, that this invention should not be limited to the disclosed embodiment, but rather should be limited only by the spirit and scope of the appended claims.

I claim:

1. An ECL buffer, disposed in an integrated circuit, having:
   an input;
   a first current source;
   first and second loads;
   a first differential pair of transistors, with a common output coupling to the first current source, first and second inputs coupling to the input of the ECL buffer, and corresponding first and second outputs coupling to the corresponding first and second loads, for coupling the first current source to either the first or second loads in response to the ECL buffer input;
   CHARACTERIZED BY:
   a second current source; and,
   a current steering means, responsive to the ECL buffer input, for selectively coupling the second current source to either the first or second load in complement to the coupling of the first current source by the first differential pair of transistors;
   wherein current supplied by the second current source is less than current supplied by the first current source.

2. The ECL buffer as recited in claim 1, wherein the current steering means is characterized by:
   a second differential pair transistors, with a common output coupled to the second current source, first and second inputs, and first and second outputs corresponding to the first and second inputs; and,
   wherein the transistors in the first and second differential pairs are cross-coupled together.

3. The ECL buffer as recited in claim 2, wherein the cross-coupling of the transistors in the first and second differential pairs is further characterized by: the first and second inputs of the second differential pair of transistors couple correspondingly to the first and second inputs of the first differential pair of transistors, and the first and second outputs of the second differential pair of transistors couple correspondingly to the second and first outputs of the first differential pair of transistors.

4. The ECL buffer as recited in claim 3, wherein the second differential pair transistors are scaled to maximize the switching speed thereof.

5. The ECL buffer as recited in claim 4, wherein the transistors are bipolar transistors.

6. The ECL buffer as recited in claim 5, further characterized by:
   a first emitter follower, having an output and coupled to the first output of the first differential pair; and,
   a second emitter follower, having an output and coupled to the second output of the first differential pair;
   wherein the outputs of the first and second emitter followers form the output of the buffer; and,
   wherein the current from the first current source substantially determines a first output logic level and the current from the second current source substantially determines a second output logic level at the output of the buffer.

7. An ECL buffer, disposed in an integrated circuit, having:
   an input;
   a first differential pair of transistors, with a common output, first and second inputs coupling to the input of the ECL buffer, and first and second outputs corresponding to the first and second inputs;
   a first current source coupled to the common output of the first differential pair of transistors; and,
   first and second loads coupled between a power supply rail and corresponding first and second outputs of the first differential pair of transistors;
   CHARACTERIZED BY:
   a second differential pair of transistors, with a common output, first and second inputs, and first and second outputs corresponding to the first and second inputs; and,
   a second current source coupled to the common output of the second differential pair;
   wherein the first and second inputs of the second differential pair of transistors couple correspondingly to the first and second inputs of the first differential pair of transistors, and the first and second outputs of the second differential pair of transistors couple correspondingly to the second and first outputs of the first differential pair of transistors; and,
   wherein current supplied by the second current source is less than current supplied by the first current source.

8. The ECL buffer as recited in claim 7, wherein the transistors are bipolar transistors and the second differential pair transistors are scaled to maximize the switching speed thereof.

9. The ECL buffer as recited in claim 8, further characterized by:
   a first emitter follower, having an output and coupled to the first output of the first differential pair; and,
   a second emitter follower, having an output and coupled to the second output of the first differential pair;
   wherein the outputs of the first and second emitter followers form the output of the buffer; and,
   wherein the current from the first current source substantially determines a first output logic level and the current from the second current source substantially determines a second output logic level at the output of the buffer.

* * * * *